Oct. 13, 1953 V. L. HEEREN 2,655,596
AUTOMATIC GAIN CONTROL CIRCUIT
Filed May 12, 1949
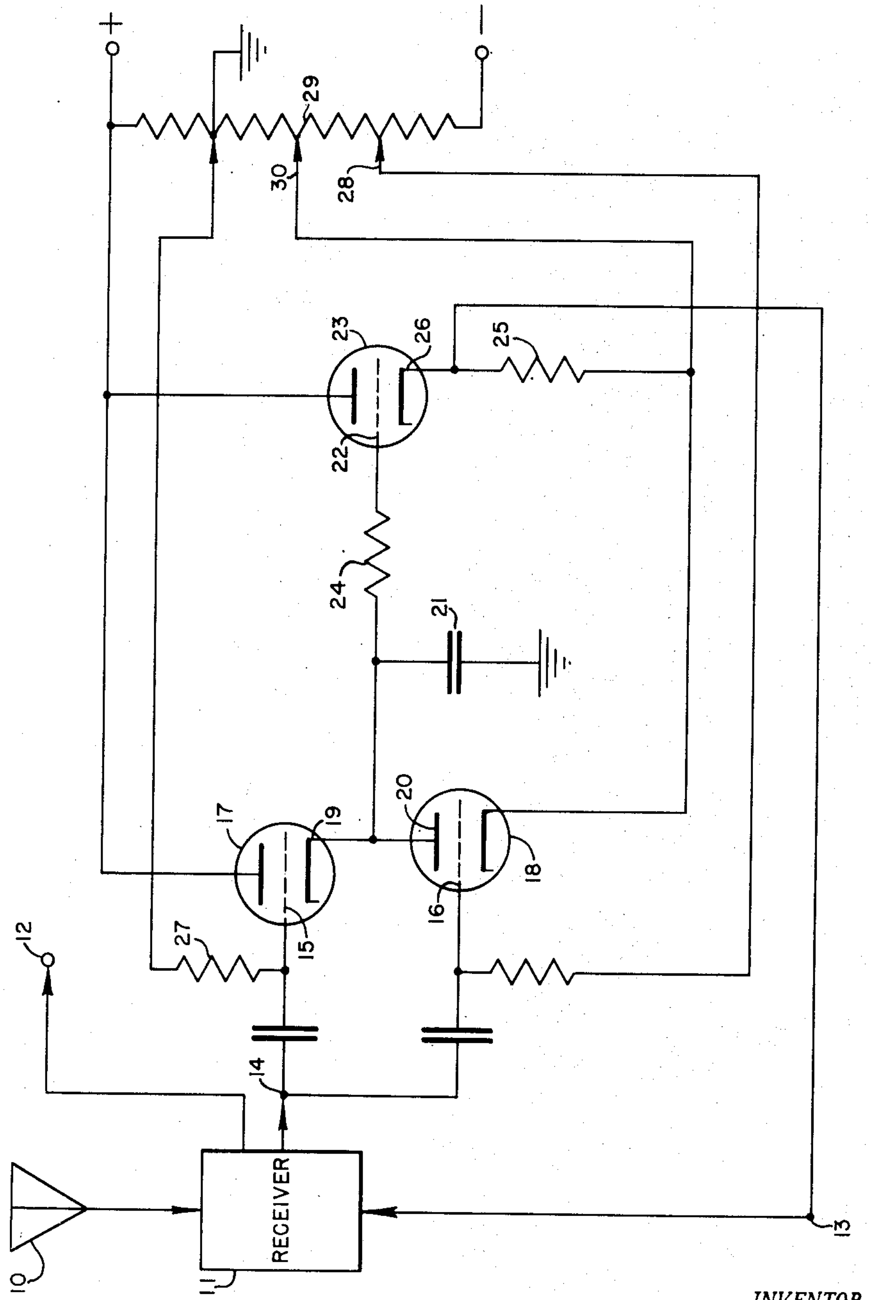
INVENTOR.
VERNON L. HEEREN
BY *M. A. Hayes*
ATTORNEY Patented Oct. 13, 1953 2,655,596

UNITED STATES PATENT OFFICE 2,655,596

AUTOMATIC GAIN CONTROL CIRCUIT

Vernon L. Heeren, Waverly, Iowa

Application May 12, 1949, Serial No. 92,936

6 Claims. (Cl. 250—20)

(Granted under Title 35, U. S. Code (1952), sec. 266)

This invention relates to signal amplitude control systems and in particular to an automatic gain control system employed to maintain substantially constant output signal amplitude from an amplifying system regardless of variations in the amplitude of input signals.

In numerous applications of radio receiving equipment it is desirable to maintain constant the amplitude of an output signal for the operation of auxiliary equipment despite unavoidable variations in the amplitude of the signal supplied to the signal input terminals of the equipment. In typical apparatus of this class it is customary to derive a biasing voltage for application to variable gain amplifier stages. This voltage is frequently supplied as a unilateral voltage which is rendered incapable of changing materially in the absence of input signals during an interval of time equal to the period of the lowest frequency component desirable in the output signal.

Another characteristic of the unilateral voltage is that it must be varied at whatever rate is required to adjust the gain of the amplifying system maintaining the substantially constant output level desired. Specifically as applied to equipment intended for operation with pulse type signals it is desirable that this unilateral voltage, which is usually abbreviated simply A. G. C. voltage, be of such a characteristic as to maintain constant amplitude output pulses. Since the input pulses may be subject to rapid amplitude variations of considerable magnitude, the customary A. G. C. network, in which the biasing voltage is filtered through a long time constant resistive-capacitive circuit, is not suitable because it cannot supply the required compromise between long time response in the interval between pulses and fast response during pulses.

It is an object of the present invention to provide automatic gain control equipment for an amplification system operative to maintain constant output signal amplitude operation with recurrent pulse type input signals of variable amplitude.

It is therefore another object of the present invention to provide means for developing an automatic gain control voltage, for pulse type signal reception equipment, which is capable of being rapidly adjusted during the reception of each individual pulse of a recurrent pulse type waveform and yet which has a relatively slow rate of variation during the time interval between succedent pulses.

Other and further objects and features of the present invention will become apparent upon a careful consideration of the following detailed description when taken together with the accompanying drawing which illustrates a typical embodiment of the invention and the manner in which that embodiment may be considered to operate.

The single figure of the drawing is a schematic diagram of a basic embodiment of the present invention intended to illustrate the fundamental features thereof.

In accordance with the fundamental concepts of the present invention an automatic gain control system is provided in which an energy storage device is charged or discharged to voltage levels in dependency on the amplitudes of succedent input signals. In the absence of input signals the energy storage device is maintained at a reference voltage level by a cathode follower type electrical circuit possessing low output impedance. Connected in shunt with the energy storage device is the anode circuit of a biased electron tube having high conductivity characteristics. In the time interval between input signals this shunt electron tube is maintained in a substantially non-conductive condition. Input signals above a predetermined amplitude raise the shunt connected tube to a condition of anode circuit conductivity to permit current flow therethrough. This flow of current tends to discharge the energy storage device and unless supplied by the cathode follower circuit, the voltage across the energy storage device will fall. Succedent input signals of amplitude lower than that of previous signals will cause current flow through the cathode follower type circuit with resulting charging of the energy storage device and rise of voltage thereacross. A time sensing network is provided in the input to the cathode follower circuit operative upon a sudden cessation of input signals to raise the voltage across the energy storage device to that of the reference level to provide full gain operation of the receiver.

With particular reference to the figure, an amplification stabilized receiver system is provided which is adapted to receive pulse type energy signals of variable amplitude from an antenna 10 and amplify them in receiver 11 in such a manner that output signals of substantially constant amplitude are supplied to output terminal 12. To accomplish this an automatic gain control signal is supplied to the receiver 11 at terminal 13. This A. G. C. signal is varied as required thereby adjusting the amplification of receiver 11. Apparatus is provided by this invention to receive an output signal from receiver 11, which signal may be the same as the signal supplied to terminal 12 and derive therefrom the control signal desired at terminal 13.

To accomplish this end, these receiver output signals are supplied to terminal 14, which is a part of the apparatus of this invention, preferably by a low impedance source within receiver 11. The signals applied to terminal 14 are of a positive pulse type. Operatively connected to terminal 14 are control elements 15, 16 of two electron tubes 17 and 18. Typically tubes 17 and 18 are shown as being of the triode high vacuum variety.

The cathode 19 of tube 17 and the anode 20 of tube 18 are connected together and to one terminal of capacitor 21. This common connection is tied to the grid 22 of a third electron tube 23 through a current limiting resistance 24. Tube 23 is here shown as of the triod high vacuum variety having its load resistance 25 disposed in the cathode circuit and is in effect a decoupling or isolating tube. Quiescent bias for tube 23 is determined by the conductivity conditions of tubes 17, 18. It is at the cathode 26 of tube 23 that the A. G. C. signal is obtained and applied to terminal 13.

In the quiescent condition wherein no signals are applied to terminal 14, tube 18 is preferably maintained non-conductive typically by virtue of the return of the grid resistance thereof to a suitable negative potential.

Also in the quiescent condition, grid 15 of tube 17 is placed near ground potential by virtue of its connection to a voltage divider 29 through resistance 27. Tube 17 can therefore conduct. This conduction current flows through resistance 24, then by diode action from grid 22 to cathode 26 of tube 23, and finally through resistance 25 to ground.

The quiescent potential of the grid 22 of tube 23 is preferably held at a reference level near ground potential. Hence the quiescent potential of terminal 13 will also be near ground potential but may readily be adjusted up or down by variation of the potential of the tap point 30 on voltage divider 29.

In operation with a series of positive pulse type input signals applied to terminal 14, grid leak bias is developed in the grid coupling circuit of tube 17, rendering the latter non-conductive except during the actual period of the pulses. The time constant of the coupling circuit components of tube 17 must be of a large enough value so as to hold tube 17 non-conductive during the period between pulses, but small enough so that the coupling circuit recovers its quiescent potential quickly if the signal decreases suddenly. While a pulse type signal is being applied to terminal 14, tube 17 is driven to full conduction for any pulse with an amplitude within the operating range of the circuit, and a fixed amount of energy is supplied to condenser 21 during each pulse.

Energy is withdrawn from condenser 21 through tube 18, and the rate of withdrawal is controlled by the amplitude of the pulse signal applied at point 14, acting on the grid of tube 18. Tube 18 is chosen of a type having a higher transconductance than tube 17 and the bias thereto is adjusted so that only positive pulses above a selected minimum amplitude are effective to produce conduction thereby.

If the series of pulse signals increases in amplitude, the rate of withdrawal of energy from condenser 21 through tube 18 becomes greater than the fixed amount being supplied through tube 17, thereby lowering the potential across condenser 21. This in turn, through tube 23, lowers the A. G. C. potential and decreases the gain of the receiver. If the pulse signals decrease in amplitude, the rate of withdrawal of energy from condenser 21 through tube 18 becomes less than the fixed amount being supplied through tube 17, causing the A. G. C. potential to change in such a direction so as to increase the gain of the receiver.

If the amplitude of the signal is not great enough to overcome the grid bias of tube 18, no energy is withdrawn from condenser 21 through tube 18, and the potential across condenser 21 rises until either the pulse amplitude becomes normal again or until the A. G. C. potential becomes high enough to allow grid 22 to conduct by diode action. If the latter condition occurs, the energy passes through resistor 24, as during the quiescent state, and the A. G. C. potential at point 13 remains at the value which causes the receiver to be at its maximum sensitivity until the signal again becomes stronger.

An essential difference between this invention and prior art conventional automatic gain controls is that tube 17 is used in the plate circuit of tube 18 instead of a plate resistor. In other words, if tube 17, resistor 27, and the coupling condenser were removed from the circuit and a plate resistor put between B-plus and plate 20, the circuit would have characteristics similar to conventional automatic gain controls. Either the tube 17 or the plate resistor serves to supply condenser 21 with the energy which tube 18 uses to control the potential across condenser 21; but the use of tube 17 has numerous advantages over the use of a simple plate resistor.

A single plate resistor would apply the same amount of energy regardless of duty cycle. Since the rate of withdrawal of energy through tube 18 is dependent upon duty cycle as well as amplitude of the signal, the level at which the amplitude of the signal is held with the automatic control would vary somewhat with the duty cycle. This does not, however, occur with the tube 17 substituted for the resistor, because tube 17 supplies energy to condenser 21 in proportion to the duty cycle of the signal. Tube 18 withdraws energy in proportion to duty cycle and amplitude. The A. G. C. voltage is therefore dependent only upon signal amplitude.

A simple plate resistor would supply the energy to condenser 21 continuously, whereas tube 18 withdraws it only during the pulses. This would cause a sawtooth distortion in the A. G. C. signal which could only be moderated to a degree by increasing the capacity of condenser 21. The sawtooth distortion is objectionable because a small change in A. G. C. voltage usually causes a large change in the gain of the receiver. It is especially objectionable if the pulse intervals are irregular. This objection is not present when tube 17 is used, because the A. G. C. voltage remains static between pulses. For this reason, the size of condenser 21 would have to be larger by a very large factor when a plate resistor is used than when tube 17 is used. For this reason a much faster response to signal amplitude changes can be effected when tube 17 is used.

If a plate resistor were used, slow response would occur when the signal decreases very rapidly. Tube 17, however, has the added feature of causing an abnormally fast recovery when the signal is lost suddenly. Normally tube 17 supplies energy for a percentage of time equal to the duration or percentage duty cycle of the pulse signal. However, shortly after the signal is lost, tube 17 begins to conduct full time because of the loss of grid leak bias. The rate of A. G. C. response is therefore speeded up by a factor inversely proportional to the duty cycle of the signal. The size of the components of the coupling circuit to tube 17 can be designed so that the interval between the time when the signal is lost and when rapid response begins is only slightly longer than the greatest interval which is expected between the pulses of the normal signal.

Response to sudden increases of signal amplitude is dependent upon the maximum transconductance of tube 18, whether using a plate resistor or tube 17 but because condenser 21 may be many times smaller as previously shown when using tube 17 than when using a plate resistor, the response is much faster when using tube 17. The maximum transconductance of tube 18 must obviously be greater than that of tube 17, and it is recommended that it be several times as great so as to get a good response to rapid increases in signal strength. This latter recommendation does not require that the transconductance of tube 18 be greater when tube 17 is used than when a plate resistor is used. Actually in the operation of specific circuits of this type, it was found that the transconductance required to provide equivalent performance in response to increases of signal was several hundred times greater when a resistor was used than when tube 17 was used. This was of course due in part to the much larger size condenser 21 which would be required when using a plate resistor.

In the event that the pulse signal at terminal 14 should cease abruptly, the grid leak bias developed in the grid circuit of tube 17 gradually leaks off through a path which may include the low impedance signal source within receiver 11. As this occurs tube 17 will eventually be returned to conduction charging capacitor 21, thereby raising the potential of terminal 13 to increase the amplification of receiver 11 and restore its sensitivity to small signals. Under certain conditions of input signal amplitude some grid leak bias may be developed in the grid circuit of tube 18.

The level of input pulse type signals at which the equipment stabilizes may be readily adjusted by variation of the tap point 28 which adjusts the bias of tube 18.

The rate at which the A. G. C. voltage can respond to variations in input signal amplitude depends primarily upon the transconductance of tubes 17 and 18, upon the size of capacitor 21, and upon the signal duty cycle. The size of capacitor 21 is selected to provide a desired rate of A. G. C. response which is necessarily a compromise because if 21 is made too small in an attempt to secure a fast response, over-compensation and hunting may result.

With normal operation of a typical circuit, compensation and control was so positive that the receiver output signal was held constant within ½ db for an 80 db change in amplitude of the signal supplied to receiver 11 from antenna 10. At the same time saturation distortions were not present and a smooth change of voltage across capacitor 21 was experienced.

From the foregoing discussion it is apparent that considerable modification of the features of the present invention is possible and while the device herein described and the form of apparatus for the operation thereof constitutes a preferred embodiment of the present invention it is to be understood that the invention is not limited to this precise device and form of apparatus and that changes may be made therein without departing from the scope of the invention which is defined in the appended claims.

The invention described herein may be manufactured and used by or for the Government of the United States of America for governmental purposes without the payment of any royalties thereon or therefor.

What is claimed is:

1. An automatic gain control circuit for a pulse energy receiver comprising a first vacuum tube circuit operatively coupled to an electrical energy storage device to supply said energy storage device with a finite amount of energy upon receipt of a pulse from a receiver connected to said circuit, a second vacuum tube circuit operatively coupled to said energy storage device to withdraw energy from said storage device, an automatic gain control line coupled to said storage device, the tube of said second circuit having a higher transconductance than the tube of said first circuit, biasing means to bias the grid of said tube of higher transconductance negative with respect to the tube of said first circuit, whereby only the first vacuum tube circuit is operative when pulses below a certain predetermined amplitude are introduced into the gain control circuit and the second vacuum tube circuit is operative only when pulses received exceed said predetermined amplitude thereby producing a smooth change of voltage across the electrical energy storage device and a smoothly changing output signal from said automatic gain control line.

2. An automatic gain control circuit as recited in claim 1 wherein the first vacuum tube circuit comprises coupling circuit components coupling said tube circuit to said receiver having a time constant large enough to hold the vacuum tube of said circuit nonconductive in the period between pulses received from the receiver, yet small enough to enable the coupling circuit to recover its quiescent potential quickly on a sudden decrease of the energy pulse signal.

3. In combination, a pulse energy receiver, an automatic gain control circuit therefor comprising, a storage device a charging circuit connected in series with said storage device including the anode-cathode space charge path of a first vacuum tube, a grid electrode in said tube coupled to said energy pulse receiver to receive the output pulses of said receiver and to control the amount of current flow through said tube in response thereto, a coupling circuit coupling said receiver and said charging circuit and having a time constant large enough to hold the vacuum tube of said charging circuit non-conductive in the period between pulses received from the receiver, yet small enough to enable the coupling circuit to recover its quiescent potential quickly on a sudden decrease of the energy pulse signal, a discharge path coupled in parallel to said energy storage device, said discharge path including the anode-cathode space charge path of a second vacuum tube, a grid electrode in said latter tube coupled to the pulse energy receiver to receive the output pulses from the receiver and to control the amount of current flowing therethrough in response to said pulses, means for biasing the grid electrode of said second vacuum tube more negative than the grid electrode of the first vacuum tube and means to derive the control voltage from said storage device for application to the receiver as an automatic gain control voltage.

4. The automatic gain control circuit of claim 3 wherein the bias of the grid of the second tube is set below cut-off value to such an amount as to preclude conduction of the tube except on the receipt of strong signals of a predetermined amplitude.

5. An automatic gain control circuit for a pulse energy receiver comprising, a storage device, a charging circuit connected in series with said storage device including the anode-cathode space charge path of a first grid controlled vacuum tube, a grid electrode in said tube coupled to said energy pulse receiver to receive the output pulses of said receiver and to control the amount of current flow through said tube in response thereto, a discharge path coupled in parallel to said energy storage device, said discharge path including the anode-cathode space charge path of a second grid controlled vacuum tube, said second tube having a relatively high transconductance compared to said first tube, a grid electrode in said second tube coupled to the pulse energy receiver to receive the output pulses from the receiver and to control the amount of current flowing therethrough in response to said pulses, means for biasing the grid electrode of said second grid controlled vacuum tube more negative than the grid electrode of the first grid controlled vacuum tube and means to derive the control voltage from said storage device for application to the receiver as an automatic gain control voltage.

6. An averaging circuit for deriving variable magnitude direct current potential from a variable amplitude pulse source comprising, a storage device, a charging circuit connected in series with said storage device including the anode-cathode space charge path of a first grid controlled vacuum tube, a grid electrode in said tube adapted to be coupled to a pulse energy source to receive the output pulses of said source and to control the amount of current flow through said tube in response thereto, a discharge path coupled in parallel to said energy storage device, said discharge path including the anode-cathode space charge path of a second grid controlled vacuum tube, said second tube having a relatively high transconductance compared to said first tube, a grid electrode in said second tube adapted to be coupled to the pulse energy source to receive the output pulses therefrom and to control the amount of current flowing therethrough in response to said pulses, means for biasing the grid electrode of said second grid controlled vacuum tube more negative than the grid electrode of said first grid controlled vacuum tube and means adapted to derive the control voltage from said storage device for application to the source as an automatic gain control voltage.

VERNON L. HEEREN.

References Cited in the file of this patent

UNITED STATES PATENTS

| Number | Name | Date |
|---|---|---|
| 2,189,925 | Reinken | Feb. 13, 1940 |
| 2,318,075 | Hollingsworth | May 4, 1943 |
| 2,441,577 | Katzin | May 18, 1948 |
| 2,451,632 | Oliver | Oct. 19, 1948 |
| 2,466,705 | Hoeppner | Apr. 12, 1949 |
| 2,568,213 | Bath | Sept. 18, 1951 |
| 2,569,289 | Clark | Sept. 25, 1951 |